US008742266B2

(12) United States Patent
Feldstein et al.

(10) Patent No.: US 8,742,266 B2
(45) Date of Patent: Jun. 3, 2014

(54) HI-DEFINITION MULTIMEDIA INTERFACE GASKET WITH FINGERS

(75) Inventors: Wendy Feldstein, Old Tappan, NJ (US); Gregory Sorrentino, Brewster, NY (US); Krunoslav Dragonanovic, Congers, NY (US)

(73) Assignee: Creston Electronics Inc., Rockleigh, NJ (US)

( * ) Notice: Subject to any disclaimer, the term of this patent is extended or adjusted under 35 U.S.C. 154(b) by 167 days.

(21) Appl. No.: 13/492,214

(22) Filed: Jun. 8, 2012

(65) Prior Publication Data

US 2013/0220692 A1 Aug. 29, 2013

Related U.S. Application Data

(60) Provisional application No. 61/604,018, filed on Feb. 28, 2012.

(51) Int. Cl.
*H05K 9/00* (2006.01)

(52) U.S. Cl.
USPC ......................... 174/355; 174/359; 439/607.3

(58) Field of Classification Search
USPC ................................ 439/607.3; 174/355, 359
See application file for complete search history.

(56) References Cited

U.S. PATENT DOCUMENTS

| | | | | |
|---|---|---|---|---|
| 4,236,779 | A | 12/1980 | Tang | |
| 4,239,318 | A | 12/1980 | Schwartz | |
| 4,512,623 | A | 4/1985 | Tomsa | |
| 4,703,133 | A | 10/1987 | Miller | |
| 4,754,101 | A | 6/1988 | Stickney et al. | |
| 5,204,496 | A | 4/1993 | Boulay et al. | |
| 5,628,653 | A | 5/1997 | Haas et al. | |
| 6,366,472 | B2 * | 4/2002 | Alina et al. | 361/800 |
| 6,474,876 | B1 | 11/2002 | Sikorski, Jr. | |
| 6,932,640 | B1 | 8/2005 | Sung | |
| 7,270,570 | B1 | 9/2007 | Hamner et al. | |
| 7,353,597 | B2 | 4/2008 | Kaplo | |
| 7,473,139 | B2 * | 1/2009 | Barringer et al. | 439/607.17 |
| 7,952,890 | B2 | 5/2011 | Myers et al. | |
| 8,672,710 | B2 * | 3/2014 | Feldstein et al. | 439/607.28 |
| 2006/0036788 | A1 | 2/2006 | Galang et al. | |
| 2009/0298334 | A1 * | 12/2009 | Takahashi | 439/607.01 |
| 2010/0022135 | A1 * | 1/2010 | Hamner et al. | 439/630 |
| 2010/0093221 | A1 * | 4/2010 | Mao et al. | 439/638 |
| 2011/0235293 | A1 * | 9/2011 | Nagata et al. | 361/767 |
| 2011/0237127 | A1 * | 9/2011 | Ohtsuji et al. | 439/607.01 |
| 2012/0071028 | A1 * | 3/2012 | Lai et al. | 439/607.19 |

* cited by examiner

*Primary Examiner* — Hung Ngo
(74) *Attorney, Agent, or Firm* — Creston Electronics Inc.

(57) ABSTRACT

An electromagnetic gasket comprises a substantially rectangular sheet having a plurality of resilient fingers on an outer peripheral. The fingers are bent outward and at least four resilient prongs are bent inward to form a passageway that is sized and dimensioned to receive an HDMI connector. When the HDMI connector is inserted through the passageway, the resilient prongs are adapted to urge against top, bottom, and two side surfaces of the shell of the HDMI connector in such a manner to prevent the gasket from disengaging from the HDMI connector. The plurality of resilient fingers extend outward and beyond the top, bottom, and two side surfaces of the shell of the HDMI connector and are adapted to urge against a surface of a faceplate. The plurality of fingers and prongs of the gasket provide a direct grounding path between surfaces of the shell of the HDMI connector and surface of the faceplate.

19 Claims, 14 Drawing Sheets

HI-DEFINITION MULTIMEDIA INTERFACE GASKET WITH FINGERS

BACKGROUND OF THE INVENTION

1. Technical Field

The present invention relates generally to a gasket. More particularly, the invention relates to a radio frequency and electromagnetic interference gasket for a Hi-Definition Multimedia Interface (HDMI) connector.

2. Background Art

HDMI is a transmission interface developed for next generation multimedia audio/video systems including DVD players, game box converters, TV boxes, etc. The maximum transmission speed of an HDMI interface can be as high as 5 Gb/s. In addition to a video signal, an HDMI interface can simultaneously transmit an 8-channel audio signal. Because HDMI is practical for transmitting digital data without compression, it effectively reduces signal interference and attenuation due to conversion between digital signal and analog signals. An HDMI connector is a small-size connector developed following the step of SATA (Serial AT attachment) interface connector.

As operating frequencies increase, reducing Electromagnetic interference (EMI) becomes more important. Although EMI affects different types of cable connectors, HDMI connectors are particularly susceptible to EMI due to their high operating frequency. EMI shielded cables and connector assemblies are frequently used for the transmission of data signals between programmable instruments, such as computers and the like, as well as in other environments in which electrical and electromagnetic radiation can be expected to interfere with the electrical signals carried by the interconnecting cables and connector assemblies. Shielding has been used for years in electrical connectors to keep unwanted radio frequency and RFI/EMI and electromagnetic pulses (EMP) from interfering with signals carried by contacts in connectors. In a simple case, EMI is reduced by mounting or connecting the HDMI connector to a printed circuit board, which is a ground plane. When the shell of the HDMI connector is electrically referenced to the ground plane, the shell of the HDMI connector itself may become a significant source of EMI energy and contribute EMI energy to the shield of the inserted video cable.

Accordingly, it is the object of the present invention to provide a gasket on a connector, such as a HDMI connector, that reduces EMI.

SUMMARY OF THE INVENTION

It is to be understood that both the general and detailed descriptions that follow are exemplary and explanatory only and are not restrictive of the invention.

DISCLOSURE OF INVENTION

Principles of the invention provide an RFI, EMI and/or EMP gasket for an HDMI connector. For example, in a first aspect of the invention, an electromagnetic gasket for use on an HDMI connector comprises a substantially rectangular sheet having a plurality of resilient fingers on an outer peripheral. The plurality of fingers is bent outward. At least four resilient prongs are bent inward to form a passageway that is sized and dimensioned to receive an HDMI connector. When the HDMI connector is inserted through the passageway, the resilient prongs are adapted to urge or push against the top, bottom, and two side surfaces of the shell of the HDMI connector in such a manner to prevent the gasket from disengaging from the HDMI connector. The plurality of resilient fingers extend outward and beyond the top, bottom, and two side surfaces of the shell of the HDMI connector and are adapted to urge or push against a surface of a faceplate. The plurality of fingers and prongs form and maintain an electrical-conductive path between surfaces of the shell of the HDMI connector and the surface of the faceplate. At least one of the four resilient prongs is shaped substantially as an isosceles trapezoid and adapted to urge or push against the top surface of the shell of the HDMI connector in such a manner as to prevent the gasket from disengaging from the HDMI connector.

In a second aspect of the invention, an electromagnetic gasket for use on an HDMI connector comprises a substantially rectangular sheet having a plurality of resilient fingers on an outer peripheral. The plurality of fingers is bent outward. The gasket further comprises at least four resilient prongs being bent inward to form a passageway that is sized and dimensioned to receive an HDMI connector. The passageway is approximately 0.583 inches in length and approximately 0.230 inches in width. When the HDMI connector is inserted through the passageway, the resilient prongs are adapted to urge or push against top, bottom, and two side surfaces of the shell of the HDMI connector in such a manner to prevent the gasket from disengaging from the HDMI connector. The plurality of resilient fingers extend outward and beyond the top, bottom, and two side surfaces of the shell of the HDMI connector and are adapted to urge or push against a surface of a faceplate. The plurality of fingers and prongs form and maintain an electrical-conductive path between surfaces of the shell of the HDMI connector and the surface of the faceplate. At least one of the four resilient prongs is shaped substantially as an isosceles trapezoid and adapted to urge or push against the top surface of the shell of the HDMI connector in such a manner as to prevent the gasket from disengaging from the HDMI connector.

The present invention seeks to overcome or at least ameliorate one or more of several problems, including but not limited to: preventing EMI from interfering with the signal being carried by contacts in an HDMI connector.

BRIEF DESCRIPTION OF DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

BRIEF DESCRIPTION OF THE SEVERAL VIEWS OF THE DRAWINGS

Figure 1:
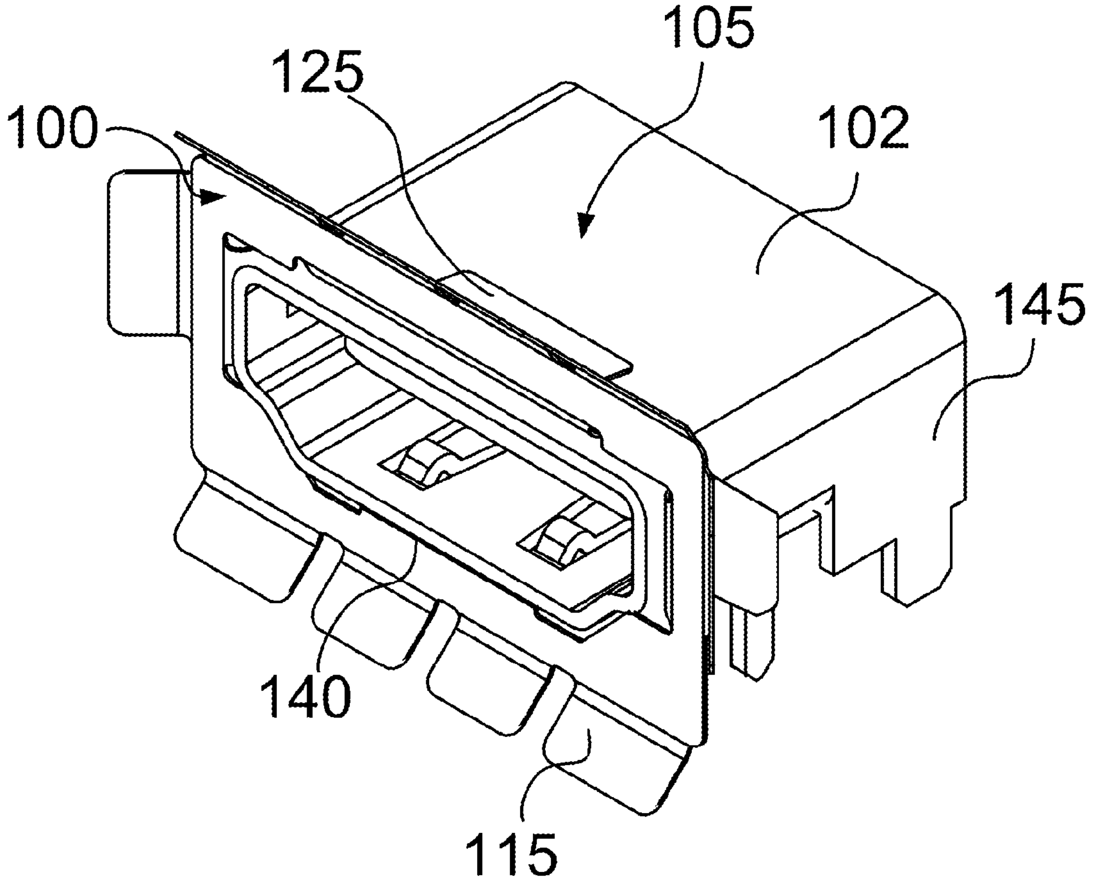

FIG. 1 is a perspective view of an electromagnetic gasket coupled to an HDMI connector in accordance with an illustrative embodiment of the present invention.

Figure 2:
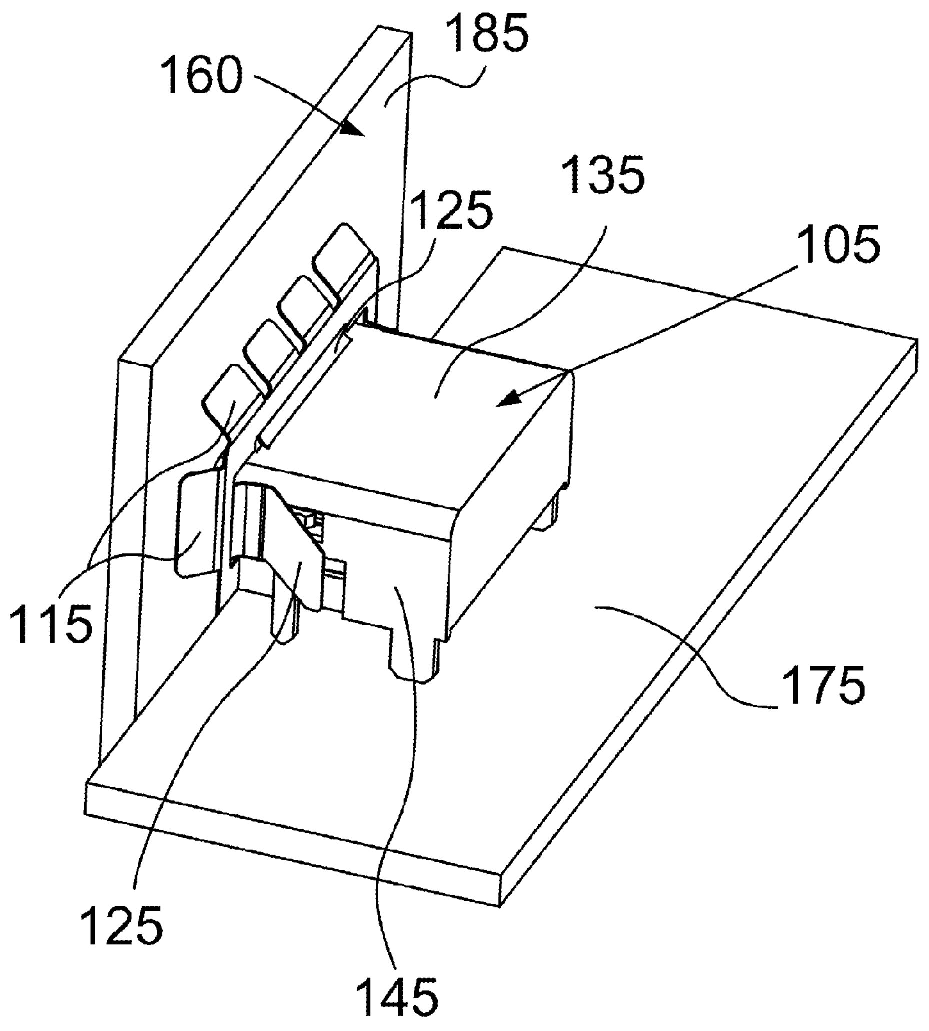
Figure 3:
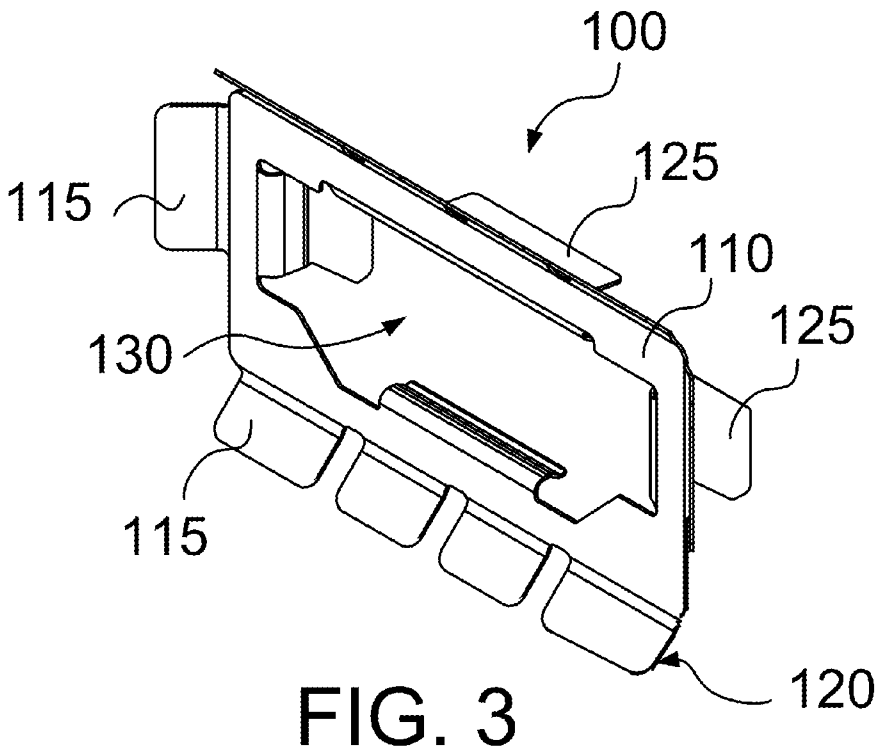

FIG. 2 is a perspective view of an electromagnetic gasket with an HDMI connector, which is mounted onto a printed circuit board in accordance with an illustrative embodiment of the present invention FIG. 3 is a front perspective view of the electromagnetic gasket in accordance with an illustrative embodiment of the present invention.

Figure 4:
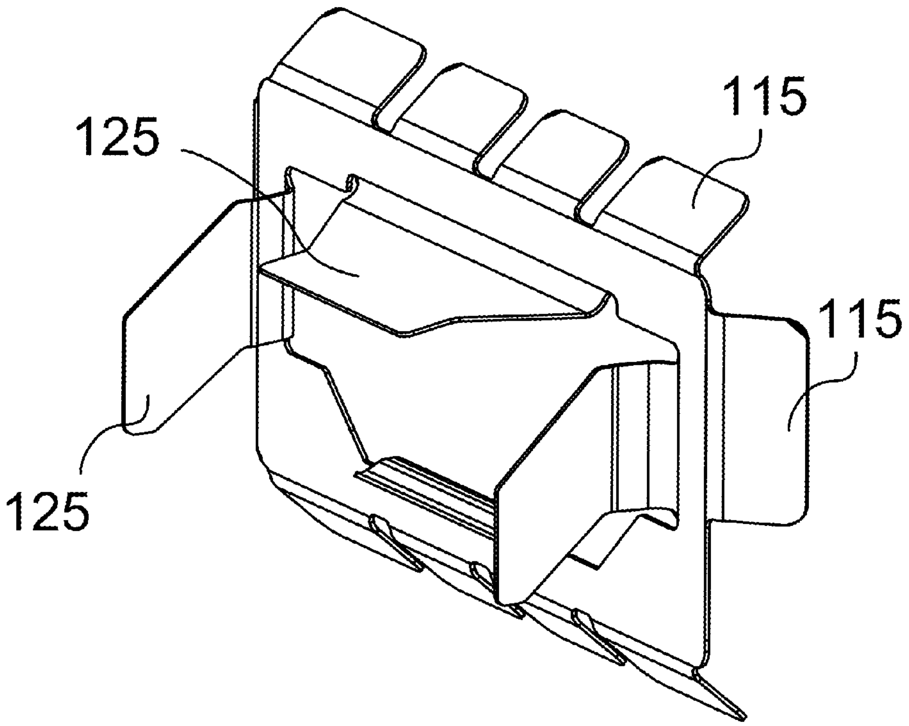

FIG. 4 is a back perspective view of the electromagnetic gasket in accordance with an illustrative embodiment of the present invention.

Figure 5:
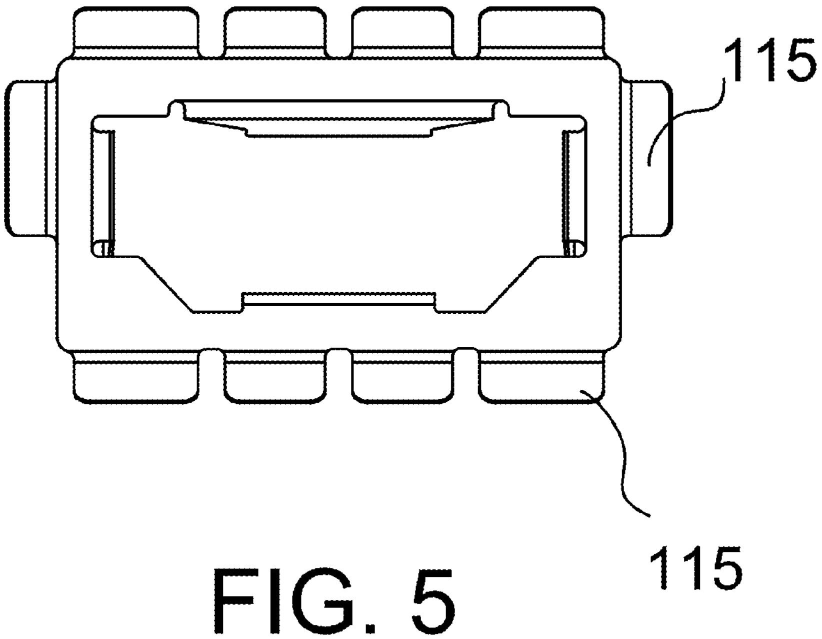

FIG. 5 is a front planar view of the formed electromagnetic gasket in accordance with an illustrative embodiment of the present invention.

Figure 6:
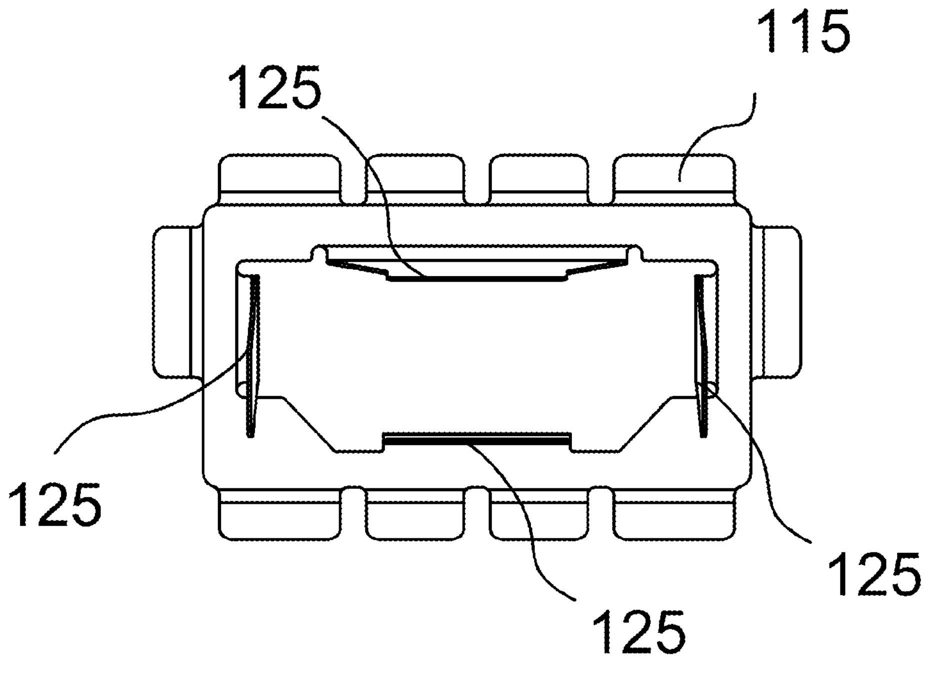

FIG. 6 is a back planar view of the formed electromagnetic gasket in accordance with an illustrative embodiment of the present invention.

Figure 7:
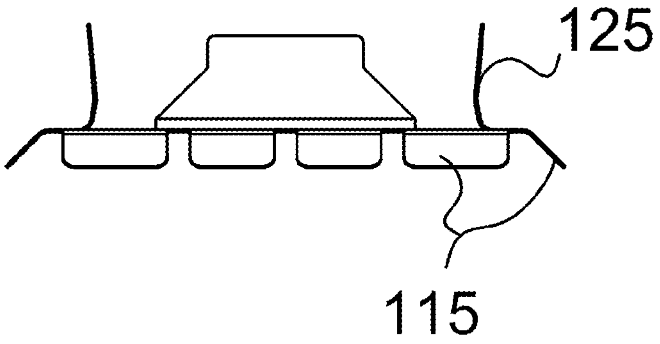

FIG. 7 is a top planar view of the electromagnetic gasket in accordance with an illustrative embodiment of the present invention.

Figure 8:
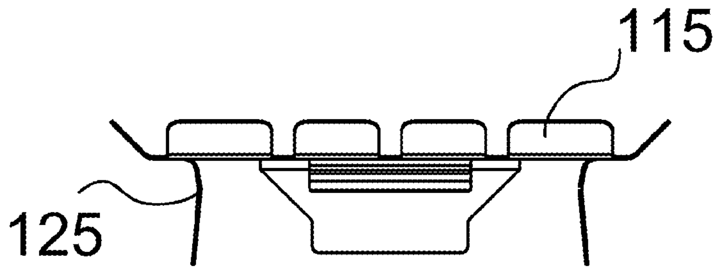

FIG. 8 is a bottom planar view of the electromagnetic gasket in accordance with an illustrative embodiment of the present invention.

Figure 9:
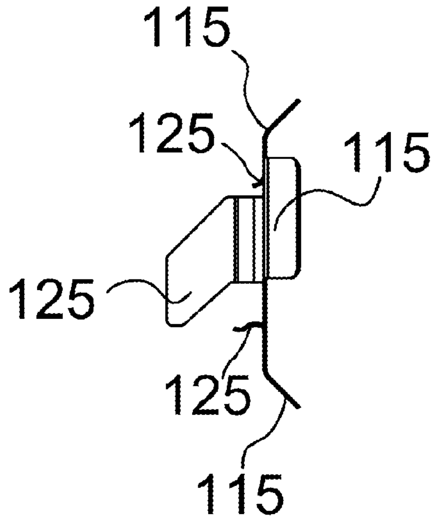

FIG. 9 is a left side planar view of the electromagnetic gasket in accordance with an illustrative embodiment of the present invention.

Figure 10:
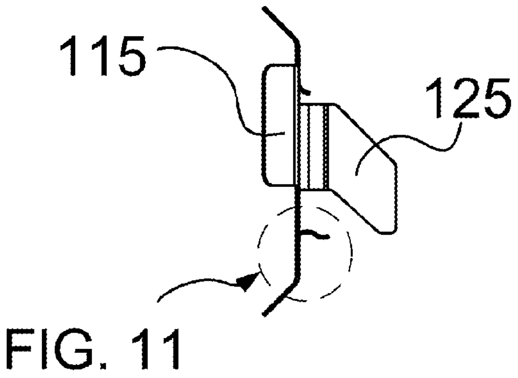

FIG. 10 is a right side planar view of the electromagnetic gasket in accordance with an illustrative embodiment of the present invention.

Figure 11:
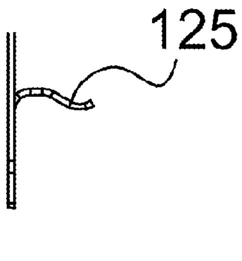

FIG. 11 is a right side planar view of the electromagnetic gasket in accordance with an illustrative embodiment of the present invention.

Figure 12:
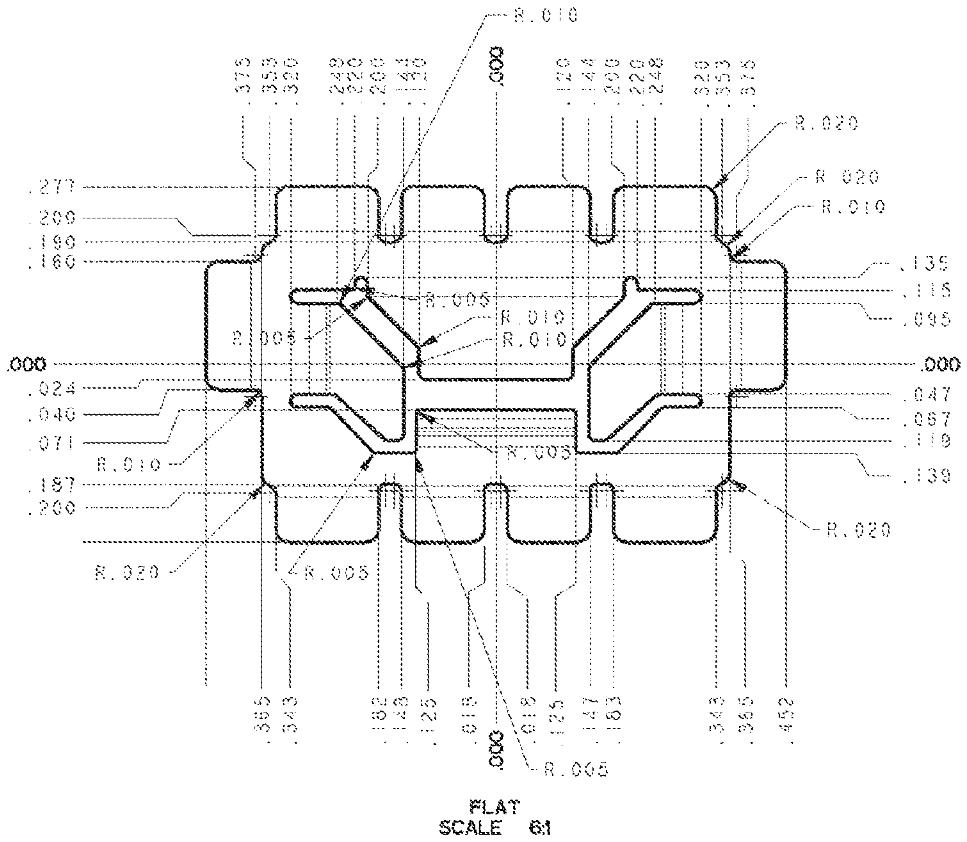

FIG. 12 is a front planar view of the electromagnetic gasket in the flat unformed with dimensions in accordance with an illustrative embodiment of the present invention.

Figure 13:
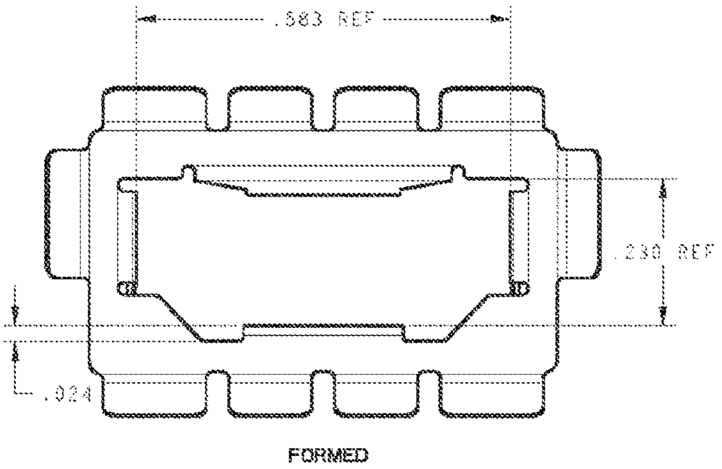

FIG. 13 is a front planar view of the electromagnetic gasket with dimensions in accordance with an illustrative embodiment of the present invention.

Figure 14:
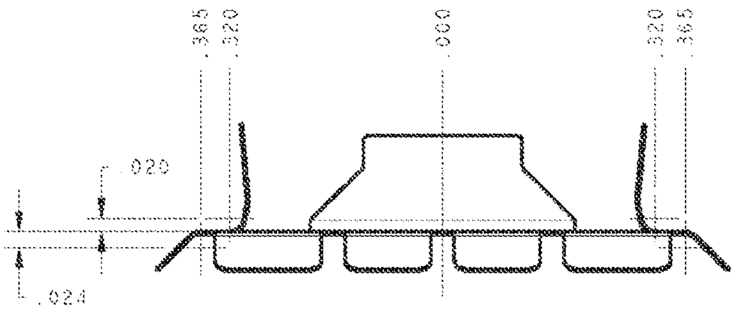

FIG. 14 is a top planar view of the electromagnetic gasket with dimensions in accordance with an illustrative embodiment of the present invention.

Figure 15:
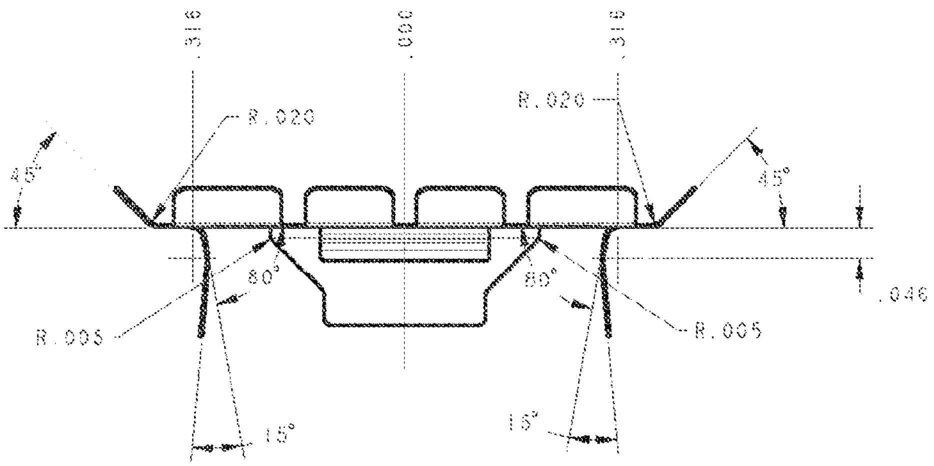

FIG. 15 is a bottom planar view of the electromagnetic gasket with dimensions in accordance with an illustrative embodiment of the present invention.

Figure 16:
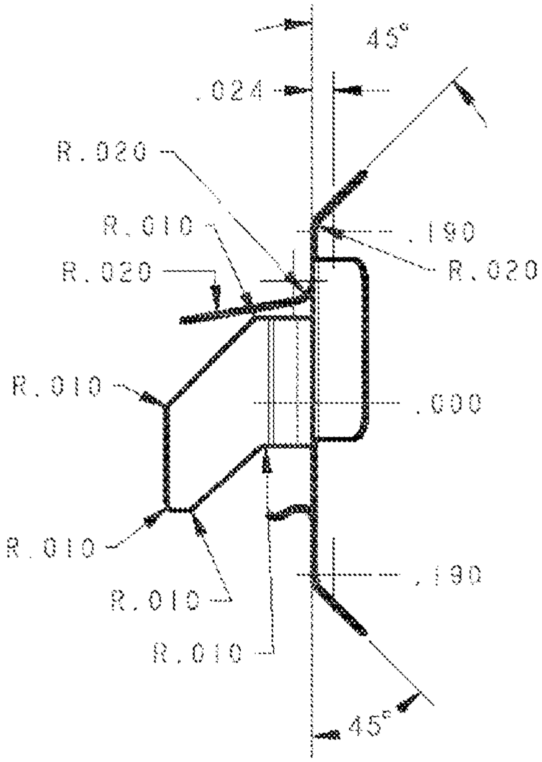

FIG. 16 is a left planar view of the electromagnetic gasket with dimensions in accordance with an illustrative embodiment of the present invention.

Figure 17:
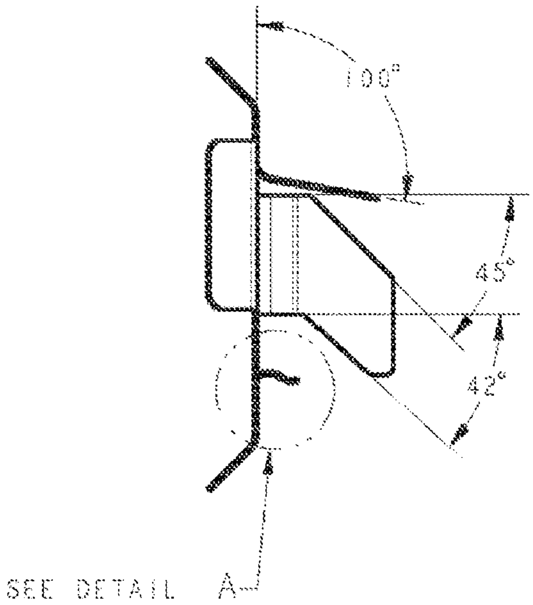

FIG. 17 is a right planar view of the electromagnetic gasket with dimensions in accordance with an illustrative embodiment of the present invention.

Figure 18:
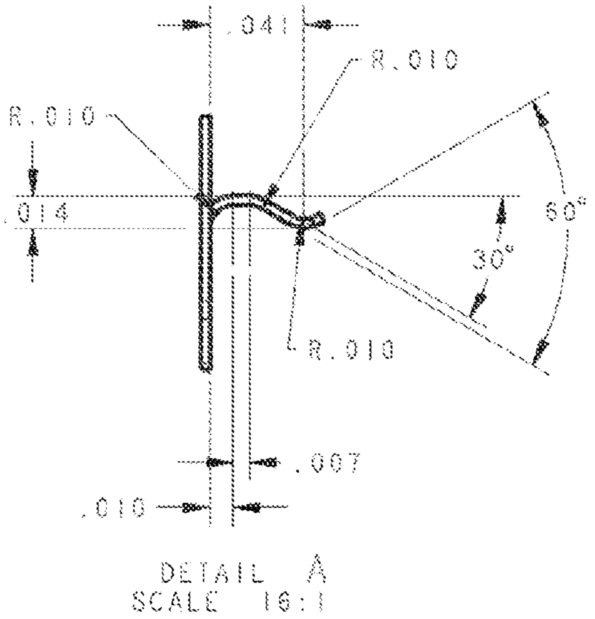

FIG. 18 is a right planar view of the electromagnetic gasket with dimensions in accordance with an illustrative embodiment of the present invention.

Figure 19:
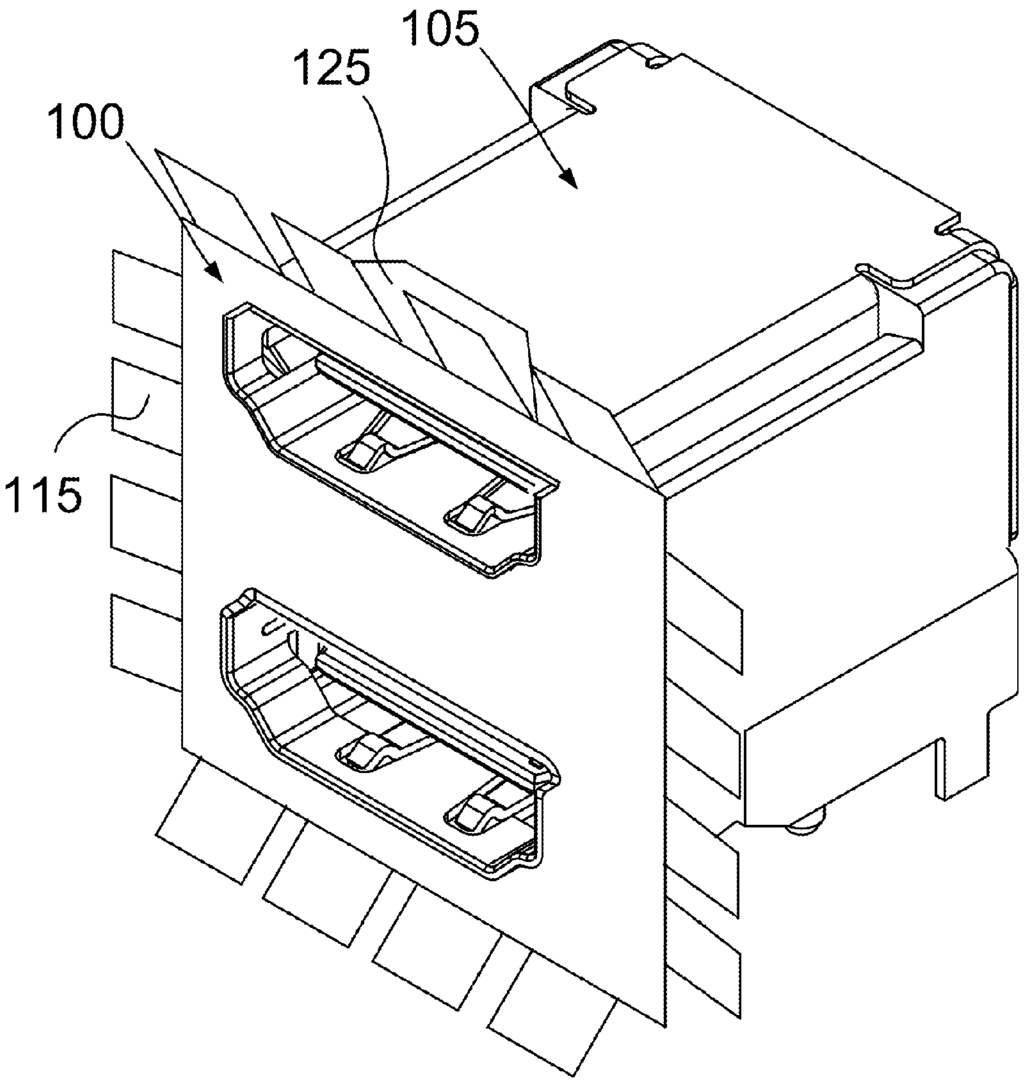

FIG. 19 is a perspective view of an electromagnetic gasket coupled to multiple HDMI connectors in accordance with an illustrative embodiment of the present invention.

LIST OF REFERENCE NUMBERS FOR THE MAJOR ELEMENTS IN THE DRAWING

The following is a list of the major elements in the drawings in numerical order.

100 electromagnetic gasket
102 connector shell of a connector (e.g., HDMI connector 105)
105 HDMI connector
110 single sheet
115 fingers
120 outer peripheral of the sheet 110
125 prongs
130 passageway
135 top surface of the shell 102
140 bottom surface of the shell 102
145 side surfaces of the shell 102
160 faceplate
175 circuit board
185 surface of the faceplate 160

DETAILED DESCRIPTION OF THE INVENTION

Definitions

"EMI" and "RFI" both refer to unwanted electromagnetic radiation signals that can potentially interfere with other signals. For purposes of brevity and consistency, this specification will use the term "EMI" when referring to such interference.

Mode(s) for Carrying Out the Invention

The present invention relates to a radio frequency and electromagnetic interference gasket for a Hi-Definition Multimedia Interface (HDMI) connector. One of the hardest challenges to overcome when attempting to achieve EMI compliance of an electronic device housed in an enclosure with connecting cables is to control the emissions of the cables. In order to overcome such challenge, a method to ground the shields of such cables to a suitable point where EMI energy is not present, or is very low, is necessary. For electronic circuits housed in metallic (conductive) enclosures, the enclosure surface itself is a grounding point. The outer surface of the enclosure is better, but the inner surface in general yields acceptable results.

The present disclosure provides a gasket (or grounding spring "clip") to provide a direct grounding path from the shield of the video cable to the enclosure of the equipment. The mounting points of the HDMI connector shell is not electrically connected to the circuit board ground plane but rather, for example, to a surface of an enclosure.

FIGS. 1 and 2 are front and back perspective views, respectively, of an electromagnetic gasket 100 mounted or connected onto a connector shell 102 of a connector (e.g., an HDMI connector 105), which in turn, is mounted onto a circuit board 175. In order to provide a direct grounding path from the shield of the video cable (not shown) to the enclosure of the equipment such as via a surface 185 of the faceplate 160, the mounting points of the HDMI connector shell 102 connects electrically to the circuit board ground plane. In other words, the gasket 100 mounts on the shell 102 in such a manner that there is direct contact with the connector shell 102 and the surface 185 of the faceplate 160 surrounding the connector opening. The return electrical path of the video cable shield is as follows: the shield braid or foil of the video cable (not shown) connects to the shell 102 of the HDMI connector 105, which in turn, is connected with the shell 102 of the mating HDMI connector 105 in the enclosure of the HDMI connector, which in turn, connects to the enclosure metal or faceplate 160 via the gasket 100. The gasket 100 does not rely on the "frame ground" trace located at the edge of the circuit board 175. As such, the gasket 100 isolates the HDMI shell from the main board circuit ground altogether. Moreover, gasket 100 is easy to install and remove during the manufacturing process and is highly reproducible.

Referring to FIGS. 3-11, the gasket 100 may be formed from a single sheet 110 that is substantially rectangular in shape. The gasket 100 has a plurality of resilient fingers 115 formed on the outer peripheral 120. The fingers 115 are bent or formed at an angle outward toward the front surface of the gasket 100. The bend radii may be 0.020 inches. The angle of the fingers 115 allows them to deflect at assembly and urge or push against the surface 185 of the faceplate 160 in such a manner that there is a "gas-tight" connection. When the faceplate 160 is constructed of oxidizing material, such as Aluminum, which creates a poor contact over time, a "gas-tight" connection is important to ensure a reliable connection over time. The resilient fingers 115 urge or push against the surface 185 of the faceplate 160 to create a "gas-tight" connection because of, in part, the fingers' 115 shape and dimensions (e.g., bend radii). The resilient fingers 115 extend beyond the top 135 (FIG. 2), bottom 140 (FIG. 1), and two side 145 (FIG. 1) surfaces of the shell 102 of the HDMI connector 105. Each gasket 100 may include any suitable number of fingers 115 with slots that may be equally spaced in-between each finger 115. In one embodiment, the gasket 100 includes ten (10) fingers 115 with a set of four (4) fingers 115 being each on the upper and lower lengths of the outer peripheral 120 and one finger 115 on each of the sides of the outer peripheral 120.

The gasket 100 further includes at least four (4) resilient prongs 125 being bent or formed at an angle inward toward the front surface of the gasket 100. The bent prongs 125 form a passageway 130 that is sized and dimensioned to receive the HDMI connector 105. In one embodiment, the passageway 130 is approximately 0.583 inches in length and approximately 0.230 inches in width. The HDMI connector 105 is inserted through and/or into the passageway 130. When the gasket 100 is inserted through the HDMI connector 105, the prongs 125 urge or push against the outside surfaces of the top 135, bottom 140, and sides 145 surfaces of the shell 102 of the HDMI connector 105. In another embodiment, when the gasket 100 is inserted through the HDMI connector 105, the prongs 125 urge or push against the inside surfaces of the top 135, bottom 140, and sides 145 surfaces of the shell 102 of the HDMI connector 105.

In one embodiment, at least one of the prongs 125 is shaped substantially as an isosceles trapezoid and adapted to urge or push against the top surface 135 of the shell of the HDMI connector 105 in such a manner as to prevent the gasket 100 from disengaging from the HDMI connector 105. An isosceles trapezoid is defined as the sides that are not in parallel are equal in length and both angles coming from a parallel side are equal. It should be understood that the prongs 125 may be other shapes (e.g., rectangular, circular, etc.) and/or a combination of different shapes as long as the prongs 125 urge or push against the surface 185 of the HDMI connector 105 to prevent the gasket 100 from disengaging from the HDMI connector 105. The fingers 115 and prongs 125 are preloaded such that when assembled, the fingers 115 and prongs 125 apply pressure against opposing parts (e.g., surface 185, top 135, bottom 140, and sides 145 surfaces of the shell 102) in assembly.

The gasket 100 may be constructed from any suitable material operative to gasket the connector 105 and/or other components from electromagnetic interference (e.g., from other components of the electronic device). In one embodiment, gasket 100 is constructed from beryllium copper alloy and plated with tin resulting in a uniform thickness of approximately, for example, 0.004 inches. In other embodiments, the gasket 100 may be constructed from an electrically conductive material such as, for example, stainless steel, steel, brass, silver, aluminum, and/or other conductive materials.

Gasket 100 may be placed on the shell 102 of the HDMI connector 105. The HDMI connector, in turn, is placed on any suitable portion of the circuit board 175 that emits EMI or is susceptible to EMI. The gasket 100 can be installed or removed individually onto/from the circuit board 175 for easy access to the HDMI connector 105 (e.g., for repair) without disturbing the HDMI connector 105 and/or other components that may be sensitive to interference.

Referring back to FIG. 2, once the HDMI connector 105 is installed onto the circuit board 175 with the faceplate 160, at least a portion of the fingers 115 flex and make contact with the faceplate 160 for a ground connection. The gasket 100 provides a direct grounding path from the shield of the video cable (not shown) to the surface 185 of the faceplate 160, which may be an enclosure of equipment. The HDMI connector shell 102 is not connected electrically to the circuit board ground plane, but rather to the faceplate 160. The resilient fingers 115 apply a biasing force against the surface 185 of the faceplate 160 to create a "gas-tight" ground connection. The fingers 115 may be flexibly biased towards the surface 185 of the faceplate 160 such that the fingers 115 may deflect when they are placed against the surface 185 of the faceplate 160, thus creating tension onto the surface 185. If the fingers 115 are removed from installation, the finger 115 may bend back to its normal or non-tensed position or may take a minimal set but will remain functional. In other words, the fingers 115 maintain the same bent radius even after being bent to another radius when the gasket 100 is installed. This allows the gasket 100 to be re-usable instead of being a one-time use component. Further, since the gasket 100 is installed onto the HDMI connector 105 separately, the gasket 100 can be sold as an off the shelf product without the HDMI connector 105. Moreover, if the HDMI connector 105 is damaged, the reusable gasket 100 can be reinstalled onto another HDMI connector without having to throw away a gasket that is integrated with an HDMI connector. This saves raw material cost by not wasting an otherwise functional gasket just because of a bad connector.

Each of the plurality of resilient fingers 115 is independently flexible, and thus can accommodate non-uniform thicknesses of the surface 185 of the faceplate 160. Some faceplates may have uneven surfaces and therefore the gasket 100 can accommodate such uneven surfaces. Each of the plurality of resilient fingers 115 is able to transition between a non-flexed state and a flexed state. The flexed state is when the finger 115 biases the surface 185 of the faceplate 160 and the non-flexed state is when the finger 115 does not apply a force onto the surface 185.

Before coupling the gasket 100 to the connector 105, the connector 105 with the fingers 115 slides away or towards the surface 185 of the faceplate 160 so as to vary the amount of force the fingers 115 apply to the surface 185. This enables the gasket 100 to accommodate varying faceplate 160 thicknesses while the fingers 115 maintain contact with the surface 185 of the faceplate 160.

The dimensions of the gasket 100 vary depending on the application.

FIGS. 12-18 are drawings with dimensions showing one embodiment of gasket 100. It should be understood that the dimensions are only an example and that other dimensions are suitable to accommodate an HDMI connector. Further, the dimensions can vary to accommodate other types of connectors and quantity of connectors. For example, FIG. 19 illustrates another gasket 100 that fits through multiple HDMI connectors 105. The gasket 100 provides a direct grounding path from the shield of the video cable (not shown) to the enclosure of equipment such as via a surface 185 of the faceplate 160.

INDUSTRIAL APPLICABILITY

To solve the aforementioned problems, the present invention is a unique device for gasketing radio frequency and EMI on an electronic device.

LIST OF ACRONYMS USED IN THE DETAILED DESCRIPTION OF THE INVENTION

The following is a list of the acronyms used in the specification in alphabetical order.

HDMI High-Definition Multimedia Interface
EMI Electromagnetic interference
RF Radio Frequency
EMP Electromagnetic pulses
SATA Serial AT attachment Alternate Embodiments Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. An electromagnetic gasket (100) for use on an HDMI connector, comprising:
- (a) a substantially rectangular sheet (110) having a plurality of resilient fingers (115) on an outer peripheral (120), the plurality of fingers being bent outward; and
- (b) at least four resilient prongs (125) being bent inward to form a passageway (130) that is sized and dimensioned to receive an HDMI connector (105);
- (c) wherein when the HDMI connector is inserted through the passageway,
  - i. the resilient prongs are adapted to urge against top (135), bottom (140), and two side surfaces (145) of a shell (102) of the HDMI connector in such a manner to prevent the gasket from disengaging from the HDMI connector,
  - ii. the plurality of resilient fingers extend outward and beyond the top, bottom, and two side surfaces of the shell of the HDMI connector and are adapted to urge against a surface (185) of a faceplate (160),
  - iii. the plurality of fingers and prongs form and maintain an electrical-conductive path between surfaces of the shell of the HDMI connector and the surface of the faceplate, and
  - iv. at least one of the four resilient prongs is shaped substantially as an isosceles trapezoid and adapted to urge against the top surface of the shell of the HDMI connector in such a manner as to prevent the gasket from disengaging from the HDMI connector; and
- (d) wherein at least a portion of the resilient prongs extends outwardly and away from the HDMI connector.

2. The gasket of claim 1, wherein the gasket is configured to be inserted through the HDMI connector in such a manner that the resilient prongs are adapted to urge against outside surfaces of the top, bottom, and two sides of the shell of the HDMI connector.

3. The gasket of claim 1, wherein the plurality of fingers and prongs are adapted to connect electrically the surface of the faceplate to a shell 102 of the HDMI connector to isolate the HDMI connector from a circuit board (175).

4. The gasket of claim 1, wherein at least one of the at least four resilient prongs is shaped substantially as an isosceles trapezoid shape with an abutting substantially squared shape that is adapted to urge against the top surface of the shell of the HDMI connector in such a manner as to prevent the gasket from disengaging from the HDMI connector.

5. The gasket of claim 1, wherein at least two of the at least four resilient prongs are similarly shaped and adapted to urge against the side surfaces of the shell of the HDMI connector in such a manner as to prevent the gasket from disengaging from the HDMI connector.

6. The gasket of claim 1, wherein at least one of the at least four resilient prongs is shaped substantially as a rectangle and adapted to urge against the bottom surface of the HDMI connector in such a manner as to prevent the gasket from disengaging from the HDMI connector.

7. The gasket of claim 1, wherein the plurality of resilient fingers being at least four fingers formed on each of the top and bottom peripherals and one finger formed on each of the side peripherals.

8. The gasket of claim 1, wherein the at least four resilient prongs being bent inward to form the passageway that is sized and dimensioned to receive at least a second HDMI connector.

9. The gasket of claim 1, wherein the sheet is composed of beryllium copper alloy.

10. The gasket of claim 9, wherein the beryllium copper alloy single sheet is plated with tin.

11. The gasket of claim 10, wherein the sheet with the tin plated beryllium Copper alloy has a uniform thickness of approximately 0.004 inches.

12. The gasket of claim 1, wherein the at least four prongs do not make an electrical contact with a circuit board (175).

13. The gasket of claim 1, wherein each of the plurality of resilient fingers Is independently flexible.

14. The gasket of claim 13, wherein each of the plurality of resilient fingers is able to transition between a non-flexed state and a flexed state, wherein the flexed state is when the finger biases the surface of the faceplate and the non-flexed state is when the finger has no force being applied.

15. The gasket of claim 1, wherein the sheet is adapted to slideably mounted on the HDMI connector through the passageway after the HDMI connector is mounted on a circuit board (175) in such a manner that each of the plurality of resilient fingers maintains contacts with the surface of the faceplate, thereby accommodating various thicknesses of the faceplate.

16. An electromagnetic gasket (100) for use on an HDMI connector (105), comprising:
- (a) a substantially rectangular sheet (110) having a plurality of resilient fingers (115) on an outer peripheral, the plurality of fingers being bent outward; and
- (b) at least four resilient prongs (125) being bent inward to form a passageway (130) that is sized and dimensioned to receive an HDMI connector (105), the passageway being approximately 0.583 inches in length and approximately 0.230 inches in width;
- (c) wherein when the HDMI connector is inserted through the passageway,
  - (i) the resilient prongs are adapted to urge against top (135), bottom (140), and two side surfaces (145) of a shell (102) of the HDMI connector in such a manner to prevent the gasket from disengaging from the HDMI connector,
  - (ii) the plurality of resilient fingers extend outward and beyond the top, bottom, and two side surfaces of the shell of the HDMI connector and are adapted to urge against a surface (185) of a faceplate (160),
  - (iii) the plurality of fingers and prongs form and maintain an electrical-conductive path between surfaces of the shell of the HDMI connector and the surface of the faceplate, and
  - (iv) at least one of the four resilient prongs is shaped substantially as an isosceles trapezoid and adapted to urge against the top surface of the shell of the HDMI connector in such a manner as to prevent the gasket from disengaging from the HDMI connector; and
- (d) wherein at least a portion of the resilient prongs extends outwardly and away from the HDMI connector.

17. The gasket of claim 16, wherein the sheet is composed of beryllium copper alloy.

18. The gasket of claim 17, wherein the beryllium copper alloy single sheet is plated with tin.

19. The gasket of claim 18, wherein the sheet with the tin plated beryllium copper alloy has a uniform thickness of approximately 0.004 inches.

* * * * *

UNITED STATES PATENT AND TRADEMARK OFFICE

CERTIFICATE OF CORRECTION

PATENT NO. : 8,742,266 B2
APPLICATION NO. : 13/492214
DATED : June 3, 2014
INVENTOR(S) : Wendy Feldstein, Gregory Sorrentino and Krunoslav Draganovic It is certified that error appears in the above-identified patent and that said Letters Patent is hereby corrected as shown below:

On the Title Page, Item (75) Inventors: change "Dragonanovic" to "Draganovic".

Signed and Sealed this
Nineteenth Day of August, 2014

Michelle K. Lee
*Deputy Director of the United States Patent and Trademark Office*

UNITED STATES PATENT AND TRADEMARK OFFICE

CERTIFICATE OF CORRECTION

PATENT NO. : 8,742,266 B2
APPLICATION NO. : 13/492214
DATED : June 3, 2014
INVENTOR(S) : Wendy Feldstein et al.

It is certified that error appears in the above-identified patent and that said Letters Patent is hereby corrected as shown below:

Title Page,

Item [75], Inventors, “Draganovic” (as corrected to read in the Certificate of Correction issued August 19, 2014) is deleted and patent is returned to its original state with third inventor last name in patent to read --Dragonanovic--.

Signed and Sealed this
Thirtieth Day of September, 2014

Michelle K. Lee

Michelle K. Lee
*Deputy Director of the United States Patent and Trademark Office*